(12) United States Patent
Ritchie et al.

(10) Patent No.: US 7,422,664 B2
(45) Date of Patent: Sep. 9, 2008

(54) METHOD FOR PLASMA IGNITION

(75) Inventors: Alan Alexander Ritchie, Pleasanton, CA (US); Adolph Miller Allen, Oakland, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/346,785

(22) Filed: Feb. 3, 2006

(65) Prior Publication Data
US 2007/0181063 A1 Aug. 9, 2007

(51) Int. Cl.
*C23C 14/34* (2006.01)
(52) U.S. Cl. .............. 204/192.12; 204/192.13; 204/298.08; 204/298.32; 204/298.34; 118/723
(58) Field of Classification Search ............ 315/111.71; 204/192.12, 192.13, 298.19, 192.33, 298.08; 118/723
See application file for complete search history.

(56) References Cited

U.S. PATENT DOCUMENTS

| | | | |
|---|---|---|---|
| 4,500,408 A | | 2/1985 | Boys et al. |
| 5,235,162 A | | 8/1993 | Nourbakhsh |
| 5,464,667 A | | 11/1995 | Kohler et al. |
| 5,976,334 A | * | 11/1999 | Fu et al. ............... 204/298.19 |
| 6,190,512 B1 | * | 2/2001 | Lantsman ............. 204/192.12 |
| 6,246,567 B1 | * | 6/2001 | Parkhe ...................... 361/234 |
| 6,280,563 B1 | | 8/2001 | Baldwin, Jr. et al. |
| 6,633,017 B1 | * | 10/2003 | Drummond et al. .... 219/121.57 |
| 6,695,954 B2 | | 2/2004 | Hong |
| 6,806,651 B1 | | 10/2004 | Chistyakov |
| 6,822,396 B2 | | 11/2004 | Gonzalez et al. |
| 6,853,142 B2 | | 2/2005 | Chistyakov |
| 7,193,173 B2 | * | 3/2007 | Wiepking et al. ...... 219/121.43 |
| 2004/0160190 A1 | | 8/2004 | Gonzalez et al. |
| 2004/0212311 A1 | | 10/2004 | Chistyakov |
| 2005/0034666 A1 | | 2/2005 | Chistyakov |

* cited by examiner

*Primary Examiner*—Douglas W. Owens
*Assistant Examiner*—Chuc Tran
(74) *Attorney, Agent, or Firm*—Moser IP Law Group

(57) ABSTRACT

A method for igniting a plasma in a semiconductor process chamber is provided herein. In one embodiment, a method for igniting a plasma in a semiconductor substrate process chamber having an electrically isolated anode, wherein the plasma has failed to ignite upon applying a plasma ignition voltage to a cathode of the process chamber, includes the steps of reducing the magnitude of the voltage applied to the cathode; reapplying the plasma ignition voltage to the cathode; and monitoring the process chamber to determine if the plasma has ignited. The step of monitoring the process chamber may have a duration of a first period of time. The step of reducing the magnitude of the voltage applied to the cathode may have a duration of a second period of time. The steps of reducing the cathode voltage magnitude and reapplying the plasma ignition voltage may be repeated until a plasma ignites.

29 Claims, 2 Drawing Sheets

METHOD FOR PLASMA IGNITION

BACKGROUND OF THE INVENTION

1. Field of the Invention

Embodiments of the invention generally relate to plasma processing in the field of semiconductor devices. More specifically, the present invention relates to methods for igniting a plasma in a process chamber during the fabrication of semiconductor devices.

2. Description of the Related Art

In some semiconductor fabrication processes, a plasma of positive ions, negative ions and neutrals is introduced to a process chamber to assist in semiconductor device formation. During processing, the plasma is repeatedly extinguished and re-ignited as new substrates are introduced to the chamber for processing. For some processes, the plasma may be extinguished and re-ignited between steps of a multi-step process being performed on a substrate within a single chamber. In addition, the plasma may self-extinguish, or drop-out, unexpectedly in the midst of a process step if the process conditions destabilize, thereby necessitating re-ignition of the plasma. At times, re-ignition of the plasma may be difficult if harsh conditions (i.e., conditions unfavorable to plasma ignition) exist in the process chamber.

For DC plasma ignition, the "Paschen curve" is generally followed, which states that the voltage required to ignite a plasma is a function of gas pressure and source-substrate dimension. Therefore, it is normally assumed that the greater the cathode voltage potential available, the higher the probability of plasma ignition. For this reason, the conventional wisdom is generally to apply and hold full cathode ignition voltage until a plasma ignites. This approach generally works if the anode (generally, the substrate) is held at a lower potential and the potential difference is sufficiently large.

However, in chamber designs were the anode (substrate) is electrically isolated, the anode can float towards the cathode potential. As the anode floats towards the cathode potential, the potential difference between the cathode and the anode is reduced. This reduction in potential difference may be sufficient to prevent plasma ignition. Moreover, the longer the cathode voltage is held at full ignition without a plasma ignition, the closer the floating anode potential will approach to the cathode potential, thereby further deterring plasma ignition.

Thus, there is a need in the art for an improved method for igniting (or re-igniting) a plasma in a semiconductor process chamber.

SUMMARY OF THE INVENTION

Embodiments for a method for igniting (or re-igniting) a plasma in a semiconductor process chamber are provided herein. A method for igniting a plasma in a semiconductor process chamber is provided herein. In one embodiment, a method for igniting a plasma in a semiconductor substrate process chamber having an electrically isolated anode, wherein the plasma has failed to ignite upon applying a plasma ignition voltage to a cathode of the process chamber, includes the steps of reducing the magnitude of the voltage applied to the cathode; reapplying the plasma ignition voltage to the cathode; and monitoring the process chamber to determine if the plasma has ignited. The step of monitoring the process chamber may have a duration of a first period of time. The step of reducing the voltage applied to the cathode may have a duration of a second period of time. The steps of reducing the cathode voltage magnitude and reapplying the plasma ignition voltage may be repeated until a plasma ignites.

In another embodiment, a method for igniting a plasma in a semiconductor substrate process chamber having an electrically isolated anode, includes the steps of applying a plasma ignition voltage to a cathode of the process chamber; reducing the magnitude of the voltage applied to the cathode to a level between about 33-67 percent of the magnitude of the plasma ignition voltage; and reapplying the plasma ignition voltage to the cathode. The method may be repeated until the plasma ignites.

BRIEF DESCRIPTION OF THE DRAWINGS

The teachings of the present invention will become apparent by considering the following detailed description in conjunction with the accompanying drawings, in which.

Where possible, identical reference numerals are used herein to designate identical elements that are common to the figures. The images in the drawings are simplified for illustrative purposes and are not depicted to scale.

The appended drawings illustrate exemplary embodiments of the invention and, as such, should not be considered as limiting the scope of the invention that may admit to other equally effective embodiments.

DETAILED DESCRIPTION

The present invention is generally a method for igniting a plasma in a process chamber, such as used in the fabrication of integrated semiconductor circuits and devices. The method generally provides a plasma ignition algorithm useful for igniting a plasma, even under harsh conditions.

Figure 1:
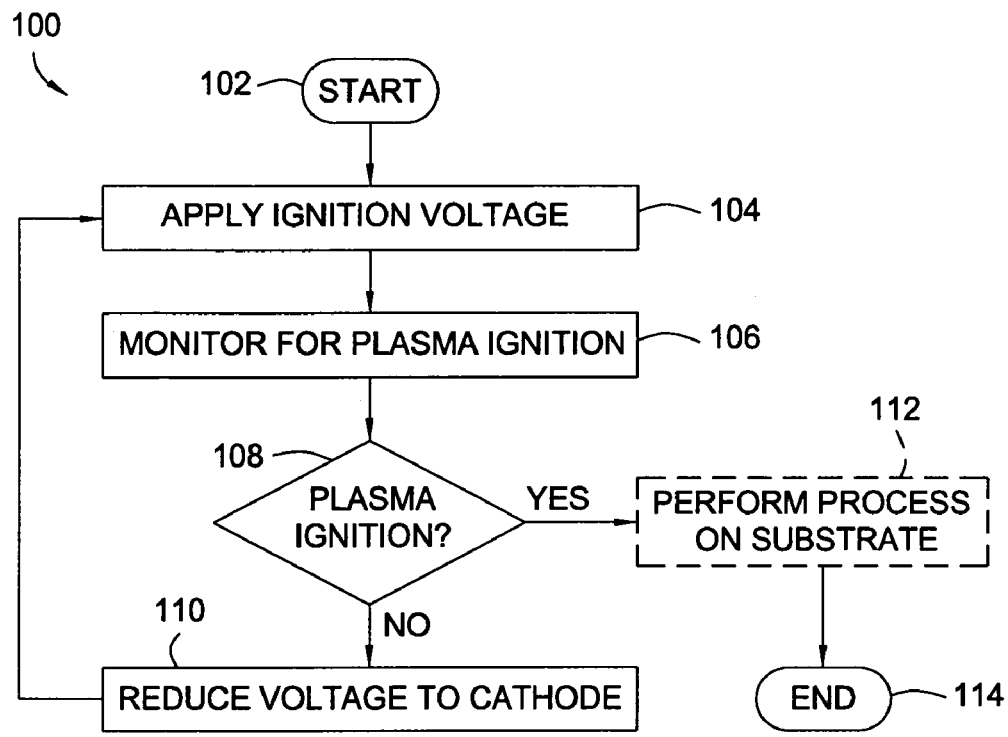
FIG. 1 depicts a flow diagram illustrating a method of a plasma ignition process in accordance with one embodiment of the present invention.

FIG. 1 depicts a flow diagram illustrating a method 100 for practicing a plasma ignition process in a process chamber in accordance with one embodiment of the present invention. The steps of the method 100 can be performed using, for example, a physical vapor deposition (PVD) chamber, among other suitable plasma-based processing chambers known to those skilled in the art. A PVD chamber suitable for performing the inventive method is briefly discussed below with reference to FIG. 3. One exemplary PVD chamber suitable for performing the method 100 is the ENDURA® Aluminum PVD reactor available from Applied Materials, Inc. of Santa Clara, Calif.

Figure 3:
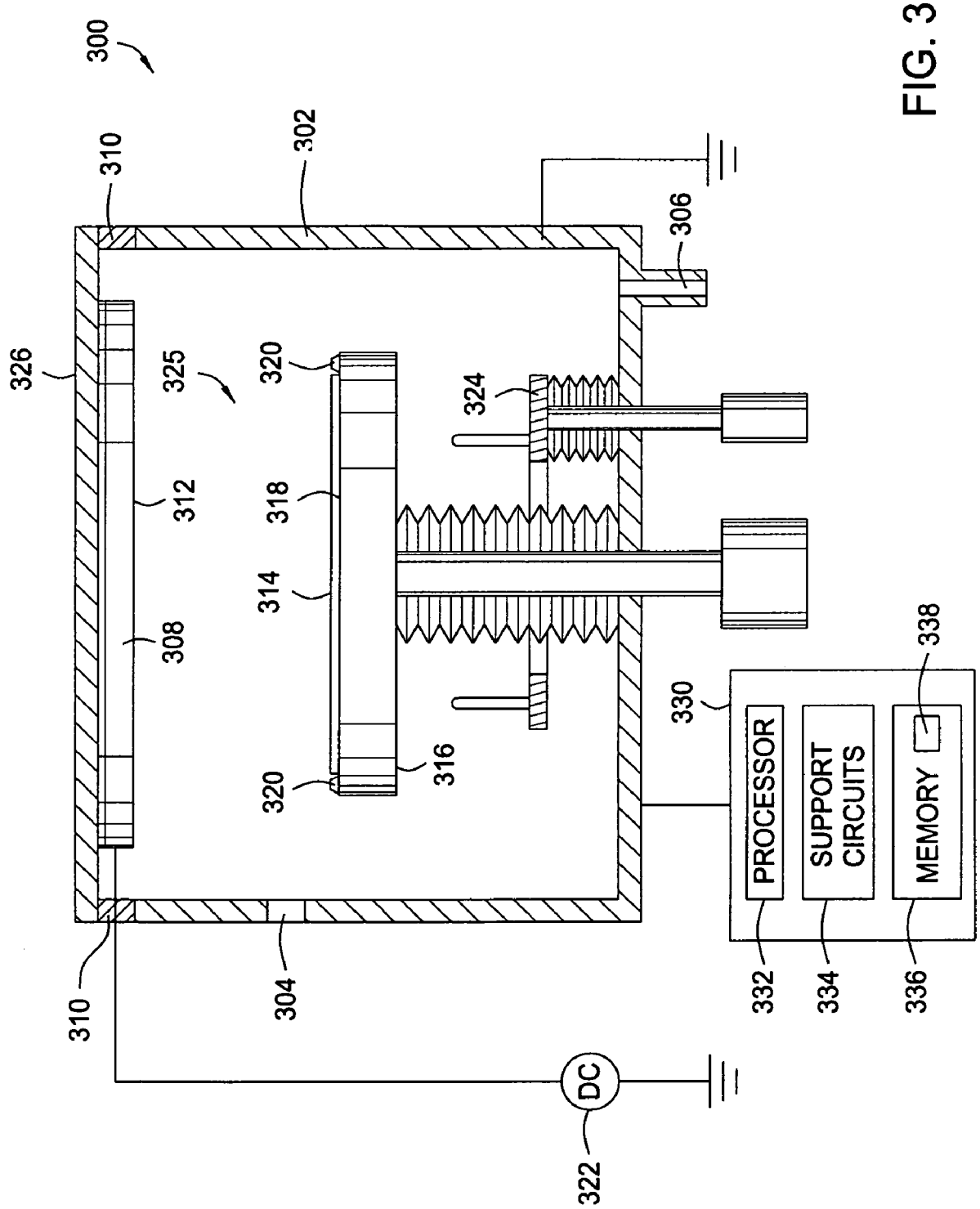
FIG. 3 depicts a schematic cross-sectional view of a process chamber suitable for performing the plasma ignition process of the present invention and subsequent PVD processes.

FIG. 3 depicts a cross-sectional view of a process chamber suitable for performing the plasma ignition process using one embodiment of the method of FIG. 1. The image in FIG. 3 is not depicted to scale and is simplified for illustrative purposes. To best understand the invention, the reader should simultaneously refer to FIGS. 1 and 3.

Prior to beginning the method 100, it is presumed that a substrate 314 is disposed upon a substrate support pedestal 316 within the process chamber 300 and a plasma is to be ignited in connection with the further processing of the substrate 314. The substrate 314 is electrically isolated, and, therefore, is allowed to float electrically. The substrate 314 typically comprises semiconductor wafers, such as crystalline silicon, silicon oxide, strained silicon, silicon on insulator (SOI), silicon germanium, doped or undoped polysilicon wafers, and the like. However, it is contemplated that other substrates undergoing plasma processing may similarly be utilized.

The method 100 starts at step 102 and proceeds to step 104, where a plasma ignition voltage is applied to a cathode (i.e., the target 308). The plasma ignition voltage may vary depending upon the size of the chamber and process conditions (e.g., atmosphere, pressure, temperature, and the like) present therein. In one embodiment for processing a 300 mm silicon substrate, the plasma ignition voltage applied is between approximately −100 and −2000V DC. In one embodiment, the plasma ignition voltage applied is approximately −1600V DC.

The actual voltage at the cathode does not immediately reach the applied ignition voltage, but instead approaches the ignition voltage over time. In addition, as the anode (e.g., the substrate 314) is electrically isolated, the anode will float towards the cathode potential over time. The plasma will generally ignite (under suitable process conditions) if the potential difference between the cathode and the anode is sufficient. In one embodiment, a plasma is expected to ignite if the potential difference between the cathode and he anode is at least −200V. In one embodiment; for processing a 300 mm silicon substrate, a plasma is expected to ignite if the potential difference between the cathode and the anode is at least −550V. It is contemplated that other potential differences may be suitable to ignite a plasma in varying process chamber sizes, geometry, and the like and/or under varying processing conditions, such as chamber pressure, gas type, sputter (e.g., target) material, and the like. Therefore, if the plasma does not ignite quickly, the reduced potential difference between the cathode and the anode will typically be insufficient to strike, or ignite, the plasma.

As such, at step 106, the chamber is monitored for a first period of time for plasma ignition. The chamber may be monitored for plasma ignition in any suitable manner known in the art, such as by monitoring the voltage and/or current on the cathode and/or the anode, monitoring the power of the power supply, optical monitoring of the interior of the chamber, and the like. Plasma detection device(s) may be disposed in or mounted upon the process chamber to verify plasma ignition. Alternatively, a chamber operator or automated monitoring system can monitor cathode voltage to detect the presence of a plasma.

The first period of time may vary based upon the size of the process chamber 300, the process conditions therein, the applied ignition voltage, and the like. The first period of time may also be theoretically calculated, derived empirically, monitored over time, or derived in any other manner. In one embodiment for processing a 300 mm silicon substrate, the first period of time may range from about 1 ms to about 1 s or more. In another embodiment, the first period of time is between about 5 ms to about 100 ms. In another embodiment, the first period of time is between about 5 ms to about 10 ms.

At step 108 it is determined whether or not a plasma has ignited in the process chamber. If, at step 108, it is determined that a plasma has ignited, the method ends at step 112. Optionally, and depicted in dashed lines, a step 112 is shown where substrate processing in the presence of the ignited plasma occurs (e.g., deposition of aluminum via PVD). Note that the substrate processing step 112 is not part of the subject plasma ignition algorithm and is shown for illustrative purposes only. As such, the step 112 need not occur to fully understand, appreciate or practice the inventive method.

If, at step 108, the plasma has not ignited at the expiration of the first period of time, then the method proceeds to step 110. At step 110, the magnitude of the voltage applied to the cathode is reduced to a level below that of the anode. Lowering the cathode voltage magnitude below the potential of the anode causes the potential of the anode to float down towards the lower potential being applied to the cathode during step 110. The potential of the anode may be estimated, calculated, measured directly, or otherwise determined. In addition, during step 110, the reduced voltage on the cathode may be held for a second period of time. As discussed above, the floating potential of the anode will approach that of the cathode over time. As such, holding the reduced-magnitude voltage on the cathode for the second period of time allows for the potential of the anode to adjust to the new level.

The second period of time may vary based upon the size of the process chamber 300, the process conditions therein, the applied voltage to the cathode, and the like. The second period of time may be theoretically calculated, derived empirically, monitored over time, or derived in any other suitable manner. The second period of time may be selected to minimize the amount of time that a plasma is not present in the chamber. In one embodiment for processing a 300 mm silicon substrate, the second period of time may range from about 1 ms to about 100 ms or more. In another embodiment, the second period of time is between about 5 ms to about 50 ms. In another embodiment, the second period of time is about 25 ms or more.

If the plasma has not ignited at the conclusion of the second period of time, the method returns to step 104, where the plasma ignition voltage is reapplied to the cathode. The plasma ignition voltage may be reapplied the cathode in the manner as described above with respect to step 104. Alternatively, the plasma ignition voltage may be different than initially applied. In addition, the plasma ignition voltage may be held for a third period of time that is different from the first period of time.

The method proceeds from step 104 as described above in a cyclical pattern until the plasma ignites. By cycling the voltage applied to the cathode in a manner as described herein, the method continuously maximizes the average potential difference between the cathode and the anode to increase the probability of plasma ignition.

Figure 2:
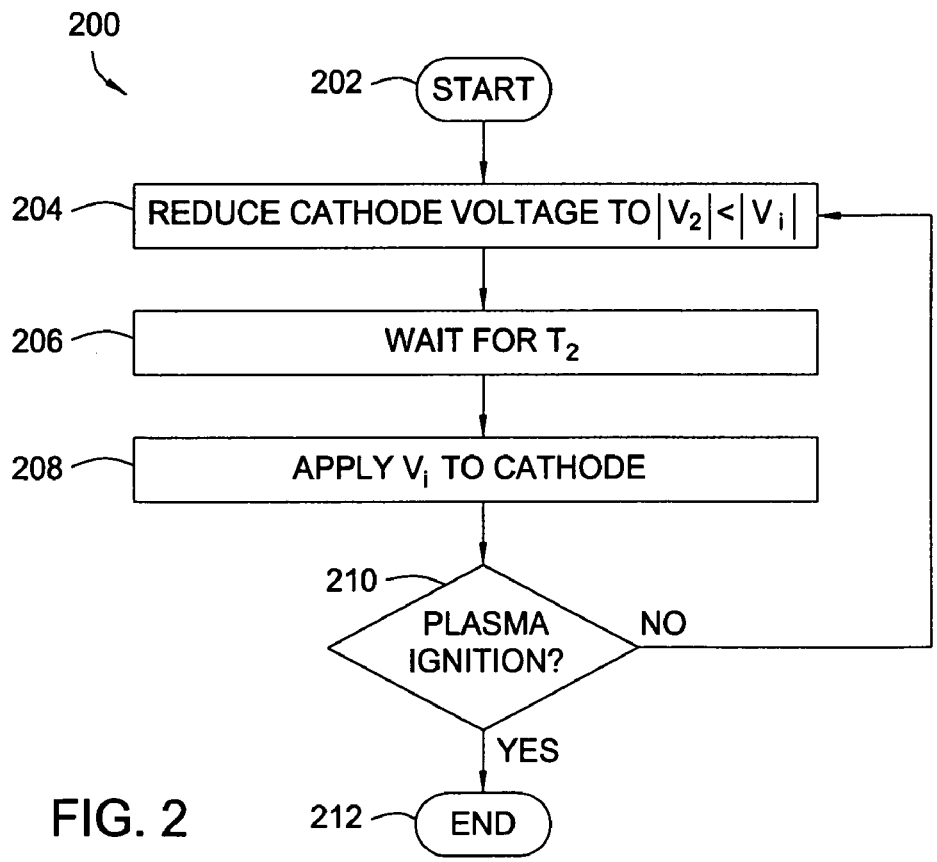
FIG. 2 depicts a flow diagram illustrating a method of a plasma ignition process in accordance with one embodiment of the subject invention.

FIG. 2 depicts a flow diagram illustrating one embodiment of a method 200 for cycling the cathode voltage suitable for use in connection with the method 100 described above with respect to FIG. 1. The method 200 is implemented upon the failure of a plasma to ignite in the process chamber 300. The failure to ignite may occur either at the beginning of a process or after premature plasma extinguishment (or plasma drop-out) during processing. As the method 200 begins upon failure to ignite, the method begins while a plasma ignition voltage $V_i$ is applied to the cathode. As described above with respect to the method 100 of FIG. 1, the plasma ignition voltage $V_i$ may be any voltage appropriate to strike a plasma in the particular process chamber under the desired process conditions. In one embodiment for processing a 300 mm silicon substrate, the plasma ignition voltage $V_i$ is approximately −1600V.

As such, the method 200 begins at step 202, and proceeds to step 204 where the cathode voltage is reduced to a voltage $V_2$ that is lower in magnitude than the plasma ignition voltage $V_i$ (i.e., the voltage applied to the cathode to ignite the plasma). The voltage $V_2$ is typically between about 33-67 percent of the magnitude of the plasma ignition voltage $V_i$. In one embodiment, the voltage $V_2$ has a magnitude that is between about 45-55 percent of the plasma ignition voltage $V_i$. In one embodiment, the voltage $V_2$ has a magnitude that is about 50 percent of the plasma ignition voltage $V_i$. It is contemplated that other percentage reductions in magnitude may be utilized depending upon plasma ignition affective variables such as chamber geometry and pressure, process gases, sputter materials, and the like.

At step 206, the lower-magnitude voltage $V_2$ is applied to the cathode for a period of time $T_2$. The period of time $T_2$ may be any time sufficient to allow the anode potential to decay towards the reduced voltage $V_2$. The period of time $T_2$ may vary based upon the size of the process chamber 300, the process conditions therein, the applied voltage to the cathode, and the like. The period of time $T_2$ may be theoretically calculated, derived empirically, monitored over time, or derived in any other suitable manner. In one embodiment for processing a 300 mm silicon substrate, the period of time $T_2$ may range from about 1 ms to about 100 ms or more. In another embodiment, the period of time $T_2$ is between about 5 ms to about 50 ms. In another embodiment, the period of time $T_2$ is about 25 ms or more.

Next, at step 208, a voltage equal to the plasma ignition voltage $V_i$ is applied to the cathode. As discussed above, the potential on the cathode will increase at a rate faster than the float of the potential on the anode. As such, there will be a potential difference generated between the cathode and the anode that should be sufficient to ignite the plasma.

At step 210, the chamber 300 is monitored for plasma ignition. As discussed above, the plasma may be detected in any manner known in the art. The monitoring step 210 may last for a period of time $T_1$ similar to the first period of time discussed above with respect to step 106 of FIG. 1. If the period of time $T_1$ expires without a plasma being detected, the method returns to step 204 where the magnitude of the cathode voltage is reduced as described above. The method 200 may be repeated as many times as desired until a plasma ignites. If a plasma is detected at any time during step 210, the method ends at step 212. Optionally, either the method 200 or the method 300 may also be stopped if a plasma fails to ignite after a certain number of cycles or a certain period of time such that appropriate corrective action may be taken. The method may then resume upon resumption of processing.

FIG. 3 depicts a schematic cross-sectional view of a PVD chamber 300 suitable for performing the plasma ignition processes of the present invention. The chamber 300 generally includes a grounded enclosure wall 302, a target 308, a substrate support pedestal 316, and a DC power source 322.

The enclosure wall 302 generally defines an interior volume 325. The enclosure wall 302 generally has at least one gas inlet 304 for providing one or more process gases, purge gases, cleaning gases, or the like to the interior volume 325. The enclosure wall 302 further has at least one exhaust outlet 306 connected to an exhaust pump (not shown) for removing gases and/or process by-products from the interior volume 325. Other ports may also be provided in the chamber 300, such as an access port (not shown) for moving substrates into and out of the chamber 300.

The target 308 is typically disposed at or near the upper portion of the chamber 300. The target 308 may be mounted on a lid 326 of the chamber 300. The target 308 is isolated from the grounded enclosure wall 302. In the embodiment depicted in FIG. 3, an insulator 310 is disposed between the lid 326 and the enclosure wall 302 to isolate the target 308 from the grounded enclosure wall 302. A DC power source 322 is coupled to the target 308 and is configured to maintain a negative voltage on the target 308 with respect to the grounded enclosure wall 302 during processing. The PVD target 308 provides a sputtering surface 312 for depositing material on a substrate 314 positioned on a support member disposed within the interior volume 325 of the chamber 300, typically substantially directly below the target 308. In the embodiment depicted in FIG. 3, a substrate support pedestal 316 is disposed beneath the target 308 to support the substrate 314 thereupon.

The pedestal 316 typically includes a generally planar surface 318 for supporting the substrate 314. The pedestal 316 is configured to electrically isolate a substrate 314 disposed thereupon. The pedestal 316 may be a moveable pedestal configured to raise and lower the substrate 314 within the interior volume 325 of the chamber 300. For example, the pedestal 316 may be movable between an upper position that holds the substrate 314 in a position closer to the target 308 during processing and a lower position that facilitates introducing and removing the substrate 314 from the chamber 300—for example, through an access port (not shown).

Optionally, additional mechanisms may be provided to facilitate receiving, positioning, and/or holding the substrate 314 in a desired location upon the pedestal 316, such as positioning pins 220. Optionally, a lift pin mechanism 224 may be provided to raise and lower the substrate 314 with respect to the pedestal 316 to facilitate exchange of the substrate onto and off of the pedestal 316. Temperature control mechanisms (not shown), such as heaters, lamps, cooling plates, cooling jackets, or the like may also be provided to facilitate control the temperature of the substrate 314 during processing. It is contemplated that additional components (not shown) may also be provided within the chamber 300, such as shadow frames, substrate clamps, shutters, and the like.

A controller 330 may be used to facilitate control of the chamber 300 as described above. The controller 330 may be one of any form of a general purpose computer processor used in an industrial setting for controlling various chambers and sub-processors. The controller 330 comprises a processor 332, such as a central processing unit (CPU), support circuits 334, and memory 336 for the controller 330. The controller 330 is coupled to the various components of the process chamber 300 to facilitate control of the process. The support circuits 334 are coupled to the processor 330 for supporting the processor in a conventional manner. These circuits typically include cache, power supplies, clock circuits, input/output circuitry and subsystems, and the like. The memory 336 is coupled to the controller 330. The memory 336, or computer-readable medium, may be one or more of readily available memory such as random access memory (RAM), read only memory (ROM), floppy disk, hard disk, or any other form of digital storage, local or remote. A software routine 338, when executed by the controller 330, causes the reactor to perform processes of the present invention and is generally stored in the memory 336. The software routine 338 may also be stored and/or executed by a second CPU (not shown) that is remotely located from the hardware being controlled by the controller 330.

The software routine 338 is executed after the substrate 300 is positioned on the pedestal 316. The software routine 338, when executed by the controller 330, transforms the general purpose computer into a specific purpose computer that controls the chamber operation such that the etching process is performed. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

Thus, a plasma ignition algorithm has been provided that continuously maximizes the average potential difference between the cathode and the anode to increase the probability of plasma ignition by exploiting the lag between the floating potential of the anode and the voltage applied to the cathode. Although the forgoing discussion referred to plasma ignition in a PVD chamber, it is contemplated that other plasma chambers used in processing integrated circuits may also benefit from the plasma ignition algorithm disclosed herein.

While the foregoing is directed to specific embodiments of the present invention, other and further embodiments of the invention may be devised without departing from the basic scope thereof, and the scope thereof is determined by the claims that follow.

What is claimed is:

1. A method for igniting a plasma in a semiconductor substrate process chamber having an electrically isolated anode, wherein the plasma has failed to ignite upon applying a plasma ignition voltage to a cathode of the process chamber, comprising:
   (a) reducing the magnitude of the voltage applied to the cathode to a level between about 33-67 percent of the magnitude of the plasma ignition voltage;
   (b) reapplying the plasma ignition voltage to the cathode; and
   (c) monitoring the process chamber to determine if the plasma has ignited.

2. The method of claim 1, wherein the plasma ignition voltage is between about −100 and −2000V DC.

3. The method of claim 1, wherein the plasma ignition voltage is about −1600V DC.

4. The method of claim 1, wherein the monitoring step has a duration equal to a first period of time.

5. The method of claim 4, wherein the first period of time is between approximately 1 ms-1 s.

6. The method of claim 4, wherein the first period of time is between approximately 5-100 ms.

7. The method of claim 4, wherein the first period of time is greater than approximately 10 ms.

8. The method of claim 1, wherein the voltage magnitude reducing step further comprises:
   reducing the magnitude of the voltage applied to the cathode to about 50 percent of the magnitude of the plasma ignition voltage.

9. The method of claim 1, wherein the voltage magnitude reducing step has a duration equal to a second period of time.

10. The method of claim 9, wherein the second period of time is between approximately 1-100 ms.

11. The method of claim 9, wherein the second period of time is between approximately 5-50 ms.

12. The method of claim 9, wherein the second period of time is greater than approximately 25 ms.

13. The method of claim 1, further comprising:
   (d) repeating steps (a)-(c) until the plasma ignites.

14. The method of claim 1, wherein step (a) further comprises:
   reducing the magnitude of the cathode voltage to approximately 50 percent of the plasma ignition voltage magnitude for a second period of time; and
   wherein the method further comprises:
   repeating steps (a)-(c) until plasma ignition occurs.

15. A method of igniting a plasma in a semiconductor substrate process chamber having an electrically isolated anode, comprising:
   (a) applying a plasma ignition voltage to a cathode of the process chamber;
   (b) reducing the magnitude of the voltage applied to the cathode to a level between about 33-67 percent of the magnitude of the plasma ignition voltage; and
   (c) reapplying the plasma ignition voltage to the cathode.

16. The method of claim 15, further comprising:
   maintaining the reduced magnitude voltage for between about 1-100 ms prior to reapplying the plasma ignition voltage to the cathode.

17. The method of claim 15, further comprising:
   repeating steps (b) and (c) until the plasma ignites.

18. A computer-readable medium containing instructions that when executed by a computer performs a plasma ignition sequence after the failure of a plasma to ignite by applying a plasma ignition voltage to a cathode in a semiconductor substrate process chamber having an isolated anode, comprising the steps of:
   (a) reducing the magnitude of the voltage applied to the cathode to a level between about 33-67 percent of the magnitude of the plasma ignition voltage;
   (b) reapplying the plasma ignition voltage to the cathode; and
   (c) monitoring the process chamber to determine if the plasma has ignited.

19. The computer-readable medium of claim 18, wherein the plasma ignition voltage is between about −100 and −2000V DC.

20. The computer-readable medium of claim 18, wherein the plasma ignition voltage is about −1600V DC.

21. The computer-readable medium of claim 18, wherein the monitoring step has a duration between approximately 1 ms-1 s.

22. The computer-readable medium of claim 18, wherein the monitoring step has a duration between approximately 5-100 ms.

23. The computer-readable medium of claim 18, wherein the monitoring step has a duration greater than approximately 10 ms.

24. The computer-readable medium of claim 18, wherein the voltage magnitude reducing step further comprises:
   reducing the magnitude of the voltage applied to the cathode to about 50 percent of the magnitude of the plasma ignition voltage.

25. The computer-readable medium of claim 18, wherein the voltage magnitude reducing step has a duration between approximately 1-100 ms.

26. The computer-readable medium of claim 18, wherein the voltage magnitude reducing step has a duration between approximately 5-50 ms.

27. The computer-readable medium of claim 18, wherein the voltage magnitude reducing step has a duration greater than approximately 25 ms.

28. The computer-readable medium of claim 18, further comprising:
   (d) repeating steps (a)-(c) until the plasma ignites.

29. The method of claim 15, wherein applying a plasma ignition voltage to a cathode of the process chamber at step (a) results in a failure to ignite the plasma.

* * * * *